United States Patent [19]

Tanahashi

[11] Patent Number: 4,757,216

[45] Date of Patent: Jul. 12, 1988

[54] LOGIC CIRCUIT FOR SELECTIVE PERFORMANCE OF LOGICAL FUNCTIONS

[75] Inventor: Toshio Tanahashi, Tokyo, Japan

[73] Assignee: NEC Corporation, Tokyo, Japan

[21] Appl. No.: 942,186

[22] Filed: Dec. 16, 1986

[30] Foreign Application Priority Data

Dec. 20, 1985 [JP] Japan .................................. 60-285471

[51] Int. Cl.⁴ ................. H03K 19/086; H03K 19/092; H03K 17/62; H03K 3/02

[52] U.S. Cl. ..................................... 307/455; 307/355; 307/357; 307/272.1; 307/289

[58] Field of Search ............... 307/455, 355, 467, 454, 307/443, 254, 357, 272.1, 289, 542

[56] References Cited

U.S. PATENT DOCUMENTS

| | | | |
|---|---|---|---|
| 3,492,588 | 1/1970 | Woodward, Jr. | 307/357 X |
| 3,509,366 | 4/1970 | Howe, Jr. et al. | 307/455 X |
| 3,509,380 | 4/1970 | Gillett et al. | 307/455 X |
| 3,643,232 | 2/1972 | Kilby | 307/455 X |
| 3,751,683 | 8/1973 | Drost | 307/455 X |
| 3,909,637 | 9/1975 | Dorler | 307/455 X |
| 3,942,033 | 3/1976 | Swiatowiec et al. | 307/455 |
| 3,984,702 | 10/1976 | Fett | 307/455 X |
| 4,112,314 | 9/1978 | Gani et al. | 307/455 X |
| 4,675,553 | 6/1987 | Price et al. | 307/272.1 X |

FOREIGN PATENT DOCUMENTS

| | | | |
|---|---|---|---|
| 1464168 | 12/1966 | France | 307/455 |
| 1484726 | 6/1967 | France | 307/455 |
| 1228491 | 4/1971 | United Kingdom | 307/455 |

Primary Examiner—Stanley D. Miller
Assistant Examiner—David R. Bertelson
Attorney, Agent, or Firm—Burns, Doane, Swecker & Mathis

[57] ABSTRACT

A logic circuit capable of selection of logical functions has an input terminal supplied with a binary signal; a first transistor with a base electrode connected to the input terminal, a collector supplied with a first voltage, and an emitter producing a first output signal; a first resistor whose one end is connected to the emitter of the first transistor and the other is supplied with a second voltage; a second transistor having a base electrode supplied with a reference voltage whose level lies between levels of the first and second voltages, an emitter connected to the emitter of the first transistor, and a collector for providing a second output signal; a second resistor whose one end is connected to the collector electrode of the second transistor and the other supplied with the first voltage. A first circuit has a first threshold value so set that the first output signal is judged to be a predetermined logical value in response to the first binary signal and to be a logical value corresponding to a logical value of the second binary signal in response to the second binary signal. A second circuit has a different threshold value so set that the second output signal is judged to be a predetermined logical value in response to the second binary signal and to be a logical value corresponding to a logical value of the first binary signal in response to the first binary signal.

2 Claims, 3 Drawing Sheets

| INPUT TERMINAL 1 | OUTPUT TERMINAL 2 | OUTPUT TERMINAL 5 | OUTPUT TERMINAL 6 |
|---|---|---|---|
| 0 (V) | -0.8 (V) | 0 (V) | -0.8 (V) |
| -0.5 (V) | -0.8 (V) | 0 (V) | -1.3 (V) |
| -1.6 (V) | -1.3 (V) | -0.5 (V) | -1.85 (V) |

| INPUT TERMINAL 1 | | OUTPUT TERMINAL 2 | OUTPUT TERMINAL 5 | OUTPUT TERMINAL 6 |
|---|---|---|---|---|
| ≥-1.05 (V) | SL | "0" | "0" | "0" |
| | SM | "0" | "0" | "1" |
| <-1.05 (V) | SH | "1" | "0" | "1" |

…

LOGIC CIRCUIT FOR SELECTIVE PERFORMANCE OF LOGICAL FUNCTIONS

BACKGROUND OF THE INVENTION

The present invention relates to a logic circuit and, more particularly, to a logic circuit capable of selection of logical functions.

Along with the progress of integrated circuit (IC) manufacturing technology in recent years, increasingly higher density has been achieved for IC's. The area S of an IC is equal to (A×B), where A and B represent its length and width, respectively, while the circumferential length L of the IC is equal to ⌊2×(A +B)⌋. A denser IC means that a greater number of circuit elements can be formed in a given area S and accordingly a greater variety of functions can be performed. However, the number of input/output (I/O) terminals that can be arranged on the circumference of the IC to be electrically connected to external circuits is limited by the length L because the terminals cannot be made infinitely minute, resulting in a tendency of the number of terminals to become insufficient. There are cases, for instance, wherein a first circuit and a second circuit, of whose functions most are common but only some are different, are formed in a single IC to reduce their production cost, and the first and second circuits are discriminately used according to the purpose of use. In such an instance, not all of the I/O terminals used by the first circuit are used by the second circuit, so that virtually useless I/O terminals are provided on the IC. This is undesirable in view of the above-mentioned tendency of the number of terminals to become insufficient.

SUMMARY OF THE INVENTION

An object of the invention is, therefore, to provide a logic circuit free from the above-mentioned disadvantage in the prior art circuit.

According to an aspect of the invention, there is provided a logic circuit having:

an input terminal supplied with a first or second binary signal as an input signal;

a first transistor having a base electrode connected to the input terminal, a collector electrode supplied with a first voltage, and an emitter electrode for providing a first output signal;

a first resistor whose one end is connected to the emitter electrode of the first transistor and the other is supplied with a second voltage;

a second transistor having a base electrode supplied with a reference voltage whose level lies between levels of the first and second voltages, an emitter electrode connected to the emitter electrode of the first transistor, and a collector electrode for providing a second output signal;

a second resistor whose one end is connected to the collector electrode of the second transistor and the other is supplied with the first voltage;

a first circuit whose first threshold value is so set that the first output signal is judged to be a predetermined logical value in response to the first binary signal and to be a logical value corresponding to a logical value of the second binary signal in response to the second binary signal; and a second circuit whose second threshold value, different from the first threshold value, is so set that the second output signal is judged to be a predetermined logical value in response to the second binary signal and to be a logical value corresponding to a logical value of the first binary signal in response to the first binary signal.

BRIEF DESCRIPTION OF THE DRAWINGS

Other features and advantages of the present invention will become apparent from the following description when taken in conjunction with the accompanying drawings in which.

In these drawings, the same reference numerals represent the identical structural elements.

DETAILED DESCRIPTION OF THE PREFERRED EMBODIMENT

Figures 1, 2, 3:
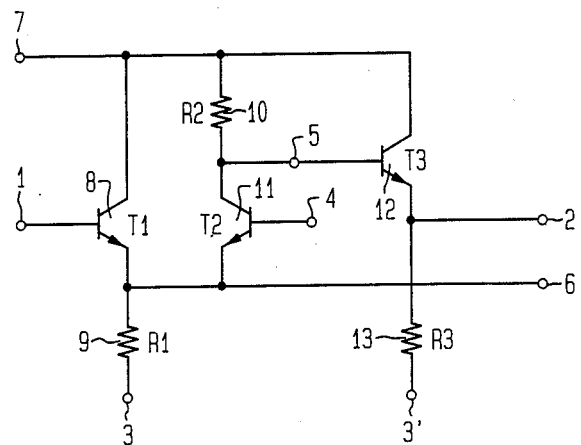
FIG. 1 is a circuit diagram of an embodiment of the invention.
FIG. 2 shows a table of the voltage relationship between terminals in the embodiment.
FIG. 3 shows a truth table for describing the operation of the embodiment.

Referring to FIG. 1, a preferred embodiment of the invention has a transistor 8 (hereinafter abbreviated to "T1") having a collector electrode (collector) connected to a power supply source terminal 7, a base electrode (base) connected to a signal input terminal 1 and an emitter electrode (emitter); a resistor 9 whose one end is connected to the emitter of the T1 and the other is connected to a power supply source terminal 3; a resistor 10 whose one end is connected to the terminal 7; a transistor 11 (T2) having a collector connected to the other end of the resistor 10, a base connected to a reference voltage terminal 4 and an emitter connected to the one end of the resistor 9; a transistor 12 (T3) having a base connected to the collector of the T2 through an output terminal 5, a collector connected to the terminal 7 and an emitter connected to an output terminal 2; a resistor 13 whose one end is connected to the terminal 2 and the other is connected to a power supply source terminal 3'; and an output terminal 6 connected to the one end of the resistor 9. To the terminal 7 is supplied a first voltage from a first power supply source unit (not shown) while to the terminal 3 is supplied a second voltage, which is lower than the first voltage, from a second power supply source unit (not shown). To the terminal 4 is supplied a reference voltage VR, which is lower than the first voltage and higher than the second voltage, from a third power supply source unit. A fourth voltage is supplied to the terminal 3' from a fourth power supply source unit (not shown). The second and fourth power supply source units may be the same.

The operation of this embodiment will now be described. It is assumed that the first voltage supplied to the terminal 7 is 0 volt (V), each of the second and fourth voltages supplied to the terminals 3 and 3' is −3.3 (V), ahd the reference voltage VR supplied to the terminal 4 is −1.05 (V). With an input voltage of −0.5 (V) fed to the terminal 1, the T1 is turned on since this voltage is higher than the reference voltage VR fed to the terminal 4, so that a current flows from the base of the T1 to the emitter thereof. At this time, the potential of the emitter of the T1 is −1.3 (V), which is lower than the input voltage to the terminal 1 by the forward direction voltage drop about {about 0.8 (V) } between the emitter and the base and is supplied to the terminal 6. Meanwhile, since the T2 is turned off, its collector potential is substantially 0 (V), which is supplied to the terminal 5. At this time, the T3 provided for the voltage adjusting purpose is turned on, and its emitter potential is −0.8 (V), which is lower than its collector potential by the forward direction voltage drop between the emitter and the base and is supplied to the terminal 2.

Next, in response to an input voltage of −1.6 (V) fed to the terminal 1, the T1 is turned off because its base potential falls below the reference voltage VR. On the other hand, the T2 is turned on, so that a current flows from its base to its emitter, and its emitter potential takes −1.85 (V), which is lower than the reference voltage VR by the forward direction voltage drop between the emitter and the base and is supplied to the terminal 6. The level of the potential appearing at the terminal 5 when the T2 is turned on can be selected as desired on the basis of the ratio between the resistances R1 and R2 of the resistors 9 and 10. For instance, if the current to flow through the resistor 9 is set at 1 milliampere (mA), the potential at the terminal 5 will be −0.5 (V) when the resistances R1 and R2 of the resistors 9 and 10 are selected to be 1.45 kiloohms (KΩ) and 500 (Ω), respectively.

Then, with an input voltage of 0 (V) fed to the terminal 1, the T1 is turned on and the T2 is turned off, since the input voltage is sufficiently higher than the reference voltage VR. Since the T2 is off, as in the above-mentioned case where the input voltage is −0.5 (V), the potentials at the terminals 5 and 2 are 0 (V) and −0.8 (V), respectively. Meanwhile, the T1 is on with its emitter potential of −0.8 (V), which is lower than the potential at the terminal 7 by the forward direction voltage drop between the base and the emitter and is supplied to the terminal 6.

The relationships between the voltage fed to the input terminal 1 and those appearing at the output terminals 2, 5 and 6 are tabulated in FIG. 2. Further, FIG. 3 shows a truth table corresponding to the table of FIG. 2, wherein −1.05 (V) is selected as threshold voltage, and voltages not lower than the threshold voltage are defined as "0" and voltages below the threshold voltage are defined as "1". In the truth table, SL, SM and SH correspond to the input voltages of 0 (V), −0.5 (V) and −1.6 (V) fed to the terminal 1, respectively.

A simple application of the embodiment will be described below with reference to FIGS. 4 to 6.

Figure 4:
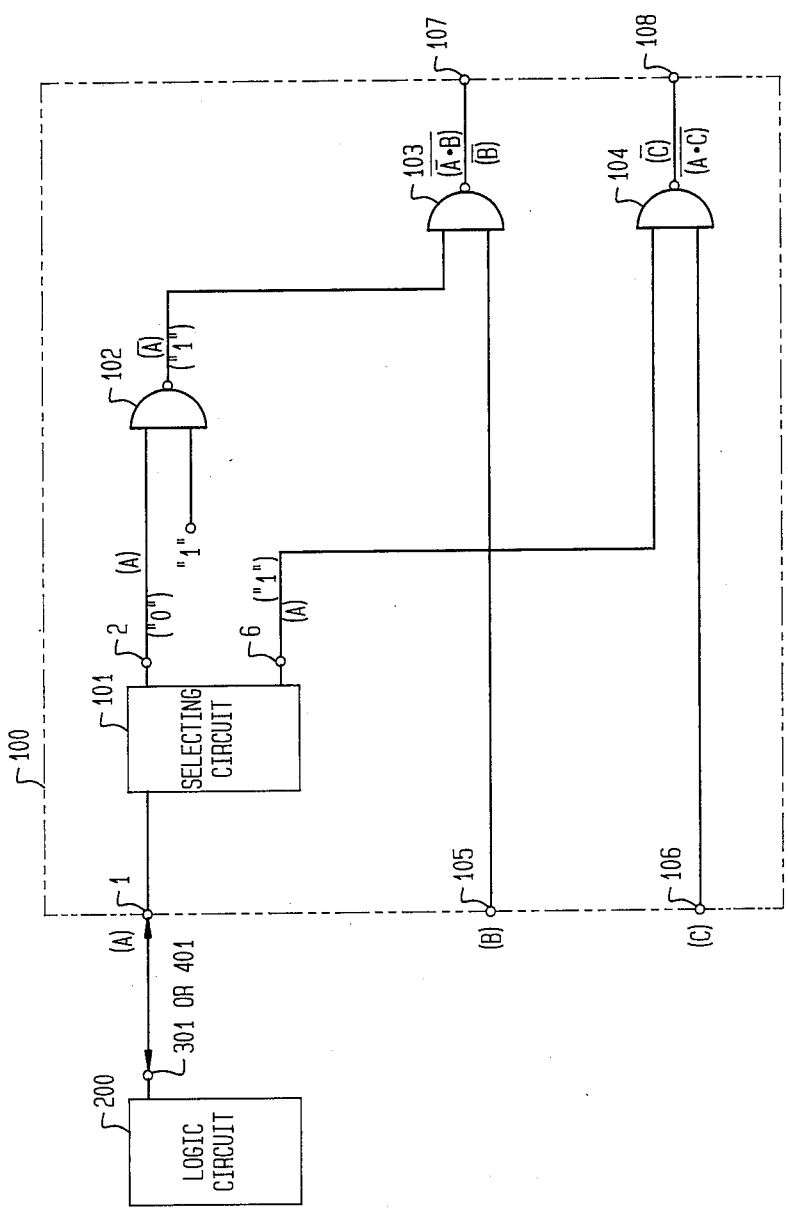
FIG. 4 is a circuit diagram for showing an application of the invention.

Referring to FIG. 4, an IC 100 has input terminals 1, 105 and 106; output terminals 107 and 108; a selecting circuit 101 of the same construction as the embodiment illustrated in FIG. 1; a NAND gate circuit 102 having a first input terminal connected to the output terminal 2 of the circuit 101 and a second input terminal to which "1" is constantly fed; a NAND gate circuit 103 having an output terminal connected to the terminal 107, a first input terminal connected to an output terminal of the circuit 102 and a second input terminal connected to the terminal 105; and a NAND gate circuit 104 having an output terminal connected to the terminal 108, a first input terminal connected to the output terminal 6 of circuit 101 and a second input terminal connected to the terminal 106. The output of a circuit 200 is supplied to the input terminal 1 of the circuit 100.

Figure 5:
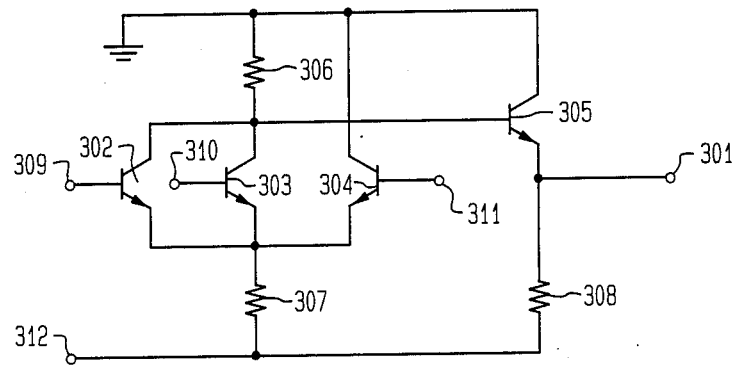
FIG. 5 is a circuit diagram of a first example of a circuit 200.

Referring now to FIG. 5, each of the NAND gates 102 to 104 has a transistor 302 having a base connected to an input terminal 309; a transistor 303 having a base connected to an input terminal 310, a collector connected to a collector of the transistor 302 and an emitter connected to an emitter of the transistor 302; a resistor 306 whose one end is grounded and the other is connected to the collector of the transistor 303; a resistor 307 whose one end is connected to a power supply source terminal 312 and the other is connected to the emitter of the transistor 303; a transistor 304 having a base connected to an input terminal 311, a grounded collector and an emitter connected to the emitter of the transistor 303; a transistor 305 having a grounded collector, a base connected to the collector of the transistor 303 and an emitter connected to an output termihal 301; and a resistor 308 whose one end is connected to the emitter of the transistor 305 and the other is connected to the terminal 312. This circuit is a NAND gate circuit of the well-known emitter-coupled transistor logic (ECL) type, and therefore detailed description of its operation is omitted here. To the power supply source terminal 312 is supplied −3.3 (V), and to the terminal 311 is fed −1.05 (V) as a reference voltage. To each of the terminals 309 and 310 are supplied −0.8 (V) as "0" and −1.3 (V) as "1". At the terminal 301 is obtained a first binary signal of −0.8 (V) as "0" and of −1.3 (V) as "1".

Figure 6:
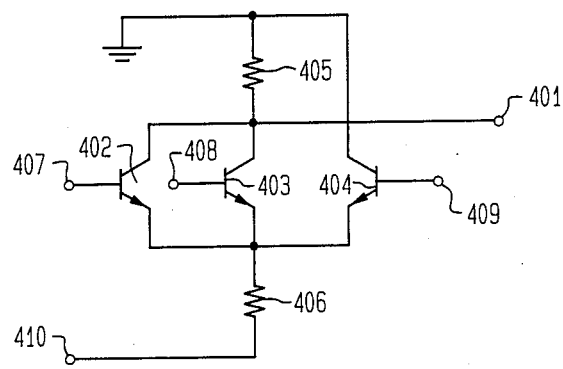
FIG. 6 is a circuit diagram of a second example of the circuit 200.

Referring next to FIG. 6, the circuit 200 comprises a transistor 402 having a base connected to an input terminal 407; a transistor 403 having a collector connected to a collector of the transistor 402, an emitter connected to an emitter of the transistor 402 and a base connected to an input terminal 408; a resistor 405 whose one end is grounded and the other is connected to the collector of the transistor 403; a resistor 406 whose one end is connected to the emitter of the transistor 403 and the other is connected to a power supply source terminal 410; and a transistor 404 having a grounded collector, an emitter connected to the emitter of the transistor 403 and a base connected to an input terminal 409. This circuit, too, is a NAND gate circuit of the well-known ECL type. For instance, to the power supply source terminal 410 is supplied −3.3 (V), and to the terminal 409 is fed −1.05 (V) as a reference voltage. To each of the terminals 407 and 408 are supplied −0.8 (V) as "0" and −1.3 (V) as "1", and to the terminal 401 is produced a second binary signal of 0 (V) as "0" and of −0.5 (V) as "1".

Now, it is assumed that the circuit shown in FIG. 5 is used as the circuit 200, whose output terminal 301 is connected to the input terminal 1 of the circuit 101. In this case, the voltage emerging at the terminal 301 of the circuit 200 is either −0.8 (V) as "0" or −1.3 (V) as "1" corresponding to SM and SH in FIG. 3, respectively. Therefore, as is evident from FIG. 3, "1" is always supplied from the output terminal 6 of the circuit 101 while a first signal (A) which is the same as the input signal (A) (A assumes either "0" or "1") given to the input terminal 1 appears at the output terminal 2. In response to "1" supplied from the terminal 6, from the NAND gate circuit 104 to the terminal 108 is supplied a signal ($\overline{C}$) obtained by a NAND operation of an input signal (C) (C assumes either "0" or "1") fed to the terminal 106 and "1". The circuit 102, since it is fed with the first signal (A) and "1", supplies a second signal ($\overline{A}$) indicative of the reversal of the logical level of the first signal (A). In response to the second signal ($\overline{A}$) and an input signal (B) (B takes either "0" or "1") fed from the terminal 105, the circuit 103 produces a signal $(\overline{A \cdot B})$ obtained by the NAND operation of these signals.

Next, it is assumed that the circuit shown in FIG. 6 is used as the circuit 200, whose output terminal 401 is connected to the input terminal 1 of the circuit 101. In this case, the voltage emerging at the terminal 401 of the circuit 200 is either 0 (V) as "0" or −0.5 (V) as "1" corresponding to SL and SM in FIG. 3, respectively. Therefore, as is evident from FIG. 3, "0" is always supplied from the output terminal 2 of the circuit 101 while a third signal (A) which is the same as the input signal (A) given to the input terminal 1 is supplied from the output terminal 6. The circuit 104 produces a signal $(\overline{A \cdot C})$ obtained by a NAND operation of the third signal (A) and the input signal (C). The circuit 102 always produces "1" by the NAND operation of "0" and "1". Therefore, the circuit 103 produces a signal $(\overline{B})$ by the NAND operation of "1" and the input signal (B).

As is evident from the foregoing descriptions, the IC 100 adopting the invention can function either to perform a pair of logical operations $(\overline{A \cdot B})$ and $(\overline{C})$ or a pair of logical operations $(\overline{B})$ and $(\overline{A \cdot C})$ in response to the input signals (A), (B) and (C). Further, the IC 100 requires no special input terminal for supplying a selecting signal or the like to the IC 100 to select either one of the two pairs of logical operations, but can select the appropriate pair according to the type of the binary signal supplied as the input signal (A).

While this invention has been described in conjunction with the embodiment thereof, it will now readily be possible for those skilled in the art to put this invention into practice in various other manners.

What is claimed is:

1. A logic circuit comprising:

an input terminal supplied with one of a first binary signal of a first voltage level and a second voltage level and a second binary signal of a third voltage level and a fourth voltage level different from said first voltage level and said second voltage level;

a first transistor having a base electrode connected to said input terminal, a collector electrode supplied with a first voltage, and an emitter electrode producing a first output signal;

a first resistor whose one end is connected to the emitter electrode of said first transistor and the other end is supplied with a second voltage;

a second transistor having a base electrode supplied with a reference voltage whose level is between levels of said first and second voltages, an emitter electrode connected to the emitter electrode of said first transistor, and a collector electrode producing a second output signal;

a second resistor whose one end is connected to the collector electrode of said second transistor and the other end is supplied with said first voltage;

a first circuit which is fed with said first output signal and whose first threshold value is so set that said first output signal is judged to be a predetermined constant logical value regardless of logical values of said first binary signal in response to said first binary signal and to be a logical value corresponding to a logical value of said second binary signal in response to said second binary signal; and a second circuit which is fed with said second output signal and whose second threshold value, different from said first threshold value, is so set that said second output signal is judged to be a predetermined constant logical value regardless of logical values of said second binary signal in response to said second binary signal and to be a logical value corresponding to a logical value of said first binary signal in response to said first binary signal.

2. The logic circuit as claimed in claim 1, which is provided within an integrated circuit having a plurality of terminals, one of which is connected to said input terminal.

* * * * *